United States Patent [19]
Iyer et al.

[11] Patent Number: 6,096,580
[45] Date of Patent: Aug. 1, 2000

[54] LOW PROGRAMMING VOLTAGE ANTI-FUSE

[75] Inventors: S. Sundar Kumar Iyer, Beacon; Liang-Kai Han, Fishkill; Robert Hannon, Wappingers Falls; Subramanian S. Iyer, Mount Kisco; Mukesh V. Khare, White Plains, all of N.Y.

[73] Assignee: International Business Machines Corporation, Armonk, N.Y.

[21] Appl. No.: 09/405,331

[22] Filed: Sep. 24, 1999

[51] Int. Cl.[7] .................................................. H01L 21/82
[52] U.S. Cl. ........................ 438/132; 438/131; 438/217; 438/215
[58] Field of Search ..................................... 438/131, 132, 438/152, 270, 273, 281, 288, 919; 257/529

[56] References Cited

U.S. PATENT DOCUMENTS

| | | |
|---|---|---|
| 4,757,359 | 7/1988 | Chiao et al. . |
| 5,258,638 | 11/1993 | Elhatem et al. ......................... 257/401 |
| 5,471,154 | 11/1995 | Gordon et al. ............................ 326/38 |
| 5,475,253 | 12/1995 | Look et al. . |
| 5,486,707 | 1/1996 | Look et al. . |
| 5,502,000 | 3/1996 | Look et al. . |
| 5,610,084 | 3/1997 | Solo de Zaldivar et al. . |
| 5,619,063 | 4/1997 | Chen et al. . |
| 5,627,092 | 5/1997 | Alsmeier et al. ........................ 438/152 |
| 5,866,933 | 2/1999 | Baukus et al. ............................ 257/368 |
| 5,915,171 | 6/1999 | Sheu et al. . |

OTHER PUBLICATIONS

S. Wolf. "Silicon Procesing for the VLSI" Sunset Beach, Calif. : Lattice Press, vol. 2 (Process Integration) pp 50, 54–55, 1986.

*Primary Examiner*—David Nelms
*Assistant Examiner*—Bradley Smith
*Attorney, Agent, or Firm*—H. Daniel Schnurmann

[57] ABSTRACT

A low programming voltage anti-fuse formed by a MOSFET (or MOS) or by a deep trench (DT) capacitor structure is described. Lowering the programming voltage is achieved by implanting a dose of heavy ions, such as indium, into the dielectric directly on the substrate or indirectly through a layer of polysilicon. The programming voltage can also be lowered on the MOSFET/MOS capacitor anti-fuse by accentuating the corners of active areas and gate areas of the device with suitable layout masks during processing. Silicon active area corner rounding steps should also be avoided in the fabrication of the anti-fuse to reduce the programming voltage. In the DT capacitor, lowering the programming voltage may be achieved by implanting the node dielectric of the DT anti-fuse with heavy ions either directly or through a conformal layer of polysilicon deposited on it or after the first amorphous silicon recess step during the fabrication of the DT capacitor.

15 Claims, 8 Drawing Sheets

IMPLANTATION OF HEAVY IONS IN THE NODE OXIDE IN DT CAPACITOR FUSES

IMPLANTATION OF HEAVY IONS IN THE NODE OXIDE IN DT CAPACITOR FUSES THROUGH A LAYER OF POLYSILICON

IMPLANTATION OF HEAVY IONS IN THE NODE OXIDE IN DT CAPACITOR FUSES AFTER RECESS I BEFORE COLLAR OXIDE FORMATION

- ☐ LIGHTLY DOPED DRAIN REGION
- ☐ SOURCE/DRAIN
- ▨ SHALLOW TRENCH ISOLATION (STI)

- ▨ SHALLOW TRENCH ISOLATION (STI)

LOW PROGRAMMING VOLTAGE ANTI-FUSE

FIELD OF THE INVENTION

This invention is related, generally, to semiconductor anti-fuse devices, and more particularly to a method of manufacturing electrically programmable anti-fuses having a low programming voltage.

BACKGROUND OF THE INVENTION

Fuses and anti-fuses have been widely used for over two decades in the semiconductor integrated circuit (IC) industry. Currently, most fuses are of a laser blown fuse type, wherein a metal strip linking two metal contacts is blown (or programmed) by a laser pulse. The state of the fuse—whether blown or not blown—is detected by a latch, and depending on the application, appropriate inferences can be made. The limitations on scaling laser fuses as the IC processing technology continues to shrink the minimum features, the ground rules for circuit design layout that have imposed rigid layout restrictions around the laser fuses, and the introduction of new dielectrics at the back end of the line processing the ICs have all contributed to a migration towards electrically programmable fuses. Electrically programmable fuses come in two versions: fuses and anti-fuses.

An anti-fuse is typically a capacitor having a structure schematically shown in FIG. 1a. A non-conducting dielectric (101) positioned between two conducting plates (102) is depicted. The default state of the anti-fuse is that of the dielectric not electrically conducting. The programmed state is determined by the dielectric electrically conducting. The programmed state can be achieved by applying a voltage sufficiently high to electrically breakdown the dielectric and make it electrically conduct between the two conducting plates (102) of the capacitor. This voltage is called the programming voltage.

During the process of manufacturing an integrated circuit, any capacitor formed with transistor gate-insulators or other in-situ grown oxides or oxy-nitrides may be used as an electrical programmable anti-fuse. In all cases, the conduction of the dielectric in the anti-fuse defines the state of the fuse. However, to be able to implement the electrically programmable anti-fuses in an IC, the programming voltage for the anti-fuse must be contained within the maximum allowable voltage on the IC and, preferably, at its operating voltage.

A MOSFET (Metal Oxide Semiconductor Field-Effect Transistor) can easily be modified to act as an anti-fuse. An electrical circuit equivalent to a MOSFET device is shown in FIG. 1b. The source (103), drain (104) and substrate (105) are electrically connected, forming one end of the conducting plate. The gate (106) provides the second conducting plate. The gate dielectric separating the two plates acts as the insulating layer.

In the present state of the art of growing gate insulators, the electric field required to breakdown (i.e., the intrinsic breakdown field) the gate oxide is greater than 15 mV/cm. This requires that a higher programming voltage be used to breakdown the gate insulator in the electrical antifuse. By way of example, a 3.5 nm thick gate oxide requires in excess of 5 V. to electrically breakdown the oxide. The on-chip voltage is approximately 3.3 V. A lower programming voltage is desirable, especially for programming electrical fuses.

Deep trench (DT) capacitors (FIG. 1c) commonly used in DRAMs may also be used as anti-fuses. They consist of a deep trench (107) having the walls covered with a thin layer of dielectric. The two plates of the capacitor are formed by doped silicon surrounding the DT (108) and by the amorphous silicon within the trench. The plates are electrically contacted from the outside at numerals 109 and 110, respectively.

Various patents related to the fabrication of anti-fuses are listed hereinafter:

U.S. Pat. Nos. 4,757,359 and 5,619,063 describe thin oxides used in an anti-fuse, and formed at the center of the oxide.

U.S. Pat. No. 5,793,094 describes the formation of a thin region anti-fuse below a via hole. It involves a sequence of process steps which differ from the fabrication of MOSFET and MOS capacitors.

U.S. Pat. Nos. 5,502,000 and 5,475,253 describe using corners to obtain lower programming voltages by forming a via in the oxide layer.

U.S. Pat. No. 5,915,171 describes how the bottom conductive layer forming sharp corners is obtained by oxidation and consumption of polysilicon.

U.S. Pat. No. 5,208,177 describes trenching the diffusion region below a dielectric layer.

U.S. Patent Nos. 5,610,084 and 5,486,707 involve implanting nitrogen and argon before growing the oxide dielectric. More particularly, thinner oxides are formed in regions that were implanted prior to the step of growing the oxide. The oxide thickness is primarily responsible for the anti-fuse programming voltage. When used in conjunction with an existing technology, the range of breakdown voltages that can be achieved in the anti-fuse is limited.

Details of the process steps required for fabricating MOSFET and MOS devices can be found in a book by Richard C. Jaeger entitled "Introduction to Micro-electronic Fabrication", vol. 5, with special reference section 1.3, pp. 6–9, "MOS Process Integration".

The formation of shallow trenches referred to in the present invention is described in a book by S. Wolf entitled "Silicon Processing for the VLSI Era", vol. 2—Process Integration", with particular reference to p. 50.

The effect of the formation of corner growth in a silicon wafer and oxide thinning at those corners, described in the invention, is referred to in the above publication by S. Wolf, (p. 55).

MOSFETs and MOS capacitors

The basic mask layout of the basic mask levels for the n-channel MOSFET and MOS capacitor structures are shown with reference to FIGS. 2, 3, 4, and 5, wherein:

The cross-section of the structure formed along the lines AA' (FIG. 2) is shown in FIG. 4.

The cross-section of the structure formed along the lines BB' (FIG. 2) is illustrated in FIG. 5.

The cross-section of the structure formed along the lines CC' (FIG. 3) is also shown in FIG. 5. The cross-sections along the lines BB' and CC' are equivalent to each other.

The fabrication process flow is typical of that used in the manufacture of MOSFET and MOS capacitors, and more particularly, in the fabrication of either p-channel or n-channel MOSFETs.

Referring now to FIGS. 2–4:

Regions 201 (FIG. 2) and 301 (FIG. 3) give rise to metal (i.e., aluminum or copper) levels 407 (FIG. 4) and 504 (FIG. 5).

Regions 202 (FIG. 2) and 303 (FIG. 3) give rise to gate polysilicon region 403 (FIG. 4) and 501 (FIG. 5) on top of the gate dielectric 404 (FIG. 4) and 502 (FIG. 5). The gate oxide thickness in the current technology can be less than 5 nm, and of the polysilicon gate, less than 200 nm.

Regions 203 (FIG. 2) and 302 (FIG. 3) give rise to an active area (AA'). All regions outside this area become the isolation region which in the current technology is by shallow trench isolation (STI).

Regions 204 (FIG. 2) and 304 (FIG. 3) are the contacts to the active area or to the gate poly-silicon and metal level.

Edges 205 (FIG. 2) are the edges of the polysilicon on the gate oxide deposited on the active area. These are referred to in more detail in the schematic cross-section illustrated in FIG. 4 by edges 401 and by the spacers 402 associated with the edges. The spacers are formed by LPCVD (Low Pressure Chemical Vapor Deposition) oxide/nitride, the size depending on the technology being used to fabricate the MOS device. Prior to the formation of the spacers, a lightly doped drain 406 is created by ion implantation. These ions are known to cause damage to the oxide at the edge below the polysilicon. To avoid short channel effects in smaller transistors, n-type dopant ions are implanted just below the lightly doped drain. They are implanted at an angle, a step which is carried out after polysilicon deposition and patterning 403. This implant is referred to as a 'halo implantation' 405. Depending on the dose, energy and species of implantation, it is known to cause damage to the oxide which affects its electric breakdown voltage.

Edges 206 (FIG. 2) and 305 (FIG. 3) result in the gate oxide extending to the border of the shallow trench isolation (STI), as shown in 503 (FIG. 5). Corner 306 (FIG. 3) is formed by the intersection of two of the gate oxide STI boundaries. A schematic cross-section of the active area and of the STI prior to the formation of the gate oxide is shown in FIG. 6. Sharp corners of the silicon active area 601 and divots 602 are formed during etch-back of the nitride that define the active area. The sharp corners and the divots can cause the gate oxide grown to become thinner at the edges, as explained in the aforementioned reference by S. Wolf, (p. 50). A thinner oxide is characterized by a lower electrical breakdown voltage.

Since the edges result in a lower breakdown voltage, certain processes are introduced to alleviate the dielectric weakness at the edges. To avoid the sharp corners of the active area at the STI boundary, and divots that result in a thinner and electrically weaker gate oxide growth, steps are taken for rounding the corners and filling the divots. These steps include:

(a) Divot fill, wherein the divot is filled with a thinner layer of nitride and the wafer is etched back in a more controlled manner.

(b) Nitride pull-back and oxide pull-back. The sacrificial pad-oxide and nitride that are deposited over the silicon wafer are used to protect the active area during the STI etch. The nitride and/or the oxide layers are pulled back from the edge of the interface between the STI and the active area immediately following the STI etch. This results in rounding the sharp corners at the edges of the active area. Rounded corners exhibit a more uniform growth of the oxide.

Deep Trench (DT) capacitor anti-fuses

As mentioned earlier, DT capacitors may also be used as anti-fuses (FIG. 1c). In the current technology, trenches (107) 7.5 μm deep and having an aspect ratio greater than 15, are etched into the silicon substrate. The silicon substrate around the trench is doped (108) to form one plate of the DT capacitor. A dielectric is formed on the walls of the DT, typically by either growing oxide or by depositing nitride and further oxidizing it. The dielectric thickness is 5 nm or less. The trench is filled with amorphous silicon.

Objects of the invention

Accordingly, it is an object of the invention to provide an anti-fuse using MOSFET devices or MOS capacitor structures, wherein by varying the implantation dose of indium or other heavy ions prior to the formation of the spacer and after the deposition of the polysilicon for the gate, the programming voltage of the anti-fuse can be varied.

It is another object of the invention to provide an anti-fuse formed using MOSFET devices or MOS capacitor structures, wherein implanting heavy ions, such as indium, on the gate oxide before the polysilicon deposition substantially reduces the programming voltage of the anti-fuse.

It is another object of the present invention to provide an anti-fuse using MOSFET devices or MOS capacitor structures, wherein the mask levels have been modified to enhance weaker spots in the anti-fuse dielectric, making it possible to achieve a lower programming voltage.

It is yet another object of the invention to provide an anti-fuse using MOSFET devices or MOS capacitor structures, wherein a lower programming voltage can be attained by allowing sharp corners and divot s to form at the edge of the active area next to the shallow trench isolation.

It is still another object of the invention to provide an anti-fuse using a deep trench (DT) capacitor structure, wherein the implantation of heavy ions, e.g., indium, in the dielectric node before filling the trench with poly or amorphous silicon reduces the programming voltage.

It is a further object of the invention to provide an antifuse using a DT capacitor structure, wherein by implanting heavy ions in the dielectric node through a thin layer of poly deposited prior to the implantation, results in a lower programming voltage.

It is still a further object of the invention to provide an anti-fuse using DT capacitor structure, wherein the implantation of indium, arsenic, tellurium, and the like into the trench after the first recess etch results in a lower programing voltage of the anti-fuse.

SUMMARY OF THE INVENTION

The first four objects of the present invention are attained by a method of fabricating an anti-fuse that includes the steps of forming a MOSFET device having a gate acting a one terminal of the anti-fuse, a source and a drain shorted to a substrate acting as a second terminal of the anti-fuse, and a polysilicon gate dielectric separating the gate from the shorted source, drain and substrate. Ions are implanted on the gate dielectric directly or through a layer of polysilicon which is deposited on the gate dielectric, wherein the dose of the implantation controls the programming voltage of the anti-fuse. Programming voltage of the anti-fuse can also be lowered using special mask shapes for lithography during the processing or by introducing process changes to form thin oxide at the active area and isolation edges.

The last three objects of the invention are attained by a method of fabricating a deep trench (DT) including the steps of forming a capacitor by way of a deep trench (DT) having a first conducting region around the deep trench acting as a first terminal of the capacitor, a second conducting region filling the deep trench acting as a second terminal of the capacitor, and a layer of dielectric on the walls of the deep trench separating the first and the second conducting regions; and implanting ions directly on the dielectric layer, through a layer of polysilicon or into the trench after the first recess, and wherein the dose of implantation controls the programming voltage of the anti-fuse.

Thus, in a first aspect of the invention there is provided a MOSFET or MOS capacitor anti-fuse, wherein the programming voltage can be modulated and lowered by implanting an appropriate dose of heavy ions, such as indium, arsenic, tellurium, and the like, on the gate oxide before and/or after the polysilicon deposition. Lowering the programming voltage can be further attained by modifying the mask levels to enhance the weaker spots in the anti-fuse dielectric. The programming voltage can also be reduced by allowing the formation of thinner oxides at the edges of the active area and of the shallow trench isolation.

In a second aspect of the invention there is provided an anti-fuse using a deep trench (DT) capacitor, wherein the implantation of heavy ions in the dielectric node before filling the trench with poly or amorphous silicon reduces the programming voltage. This reduction in the programming voltage may also be achieved by implanting heavy ions, such as indium, etc., in the dielectric node through a thin layer of polysilicon deposited prior to the implantation. Another approach is to implant heavy ions, such as indium, into the trench after the first recess etch step during the formation of the DT capacitor.

BRIEF DESCRIPTION OF THE DRAWINGS

The accompanying drawings, which are incorporated in this invention disclosure and which constitute a part of the specification, illustrate presently preferred embodiments of the invention and, together with the general description of the present embodiments given below, serve to explain the principles of the invention.

In FIG. 14a, the ions are directly implanted in the dielectric node; in FIG. 14b, the ions are implanted in the dielectric node through a layer of polysilicon; and in FIG. 14c, the implantation takes place after the first recess step during the DT fabrication process.

DETAILED DESCRIPTION OF THE INVENTION

Two embodiments of the present invention representing two types of anti-fuses will be discussed hereinafter:

(1) Anti-fuses that are based on a MOSFET/MOS capacitor, wherein the (non-conducting) dielectric is a "gate dielectric material", i.e., an in-situ grown silicon oxide, and (2) anti-fuses based on a deep trench (DT) capacitor wherein the non-conducting dielectric acts as the node insulator that is deposited or grown within the trench.

MOSFET and MOS Capacitors Anti-fuse [A–D]

A. Implantation of the sate dielectric through a polysilicon layer

Figure 1A:
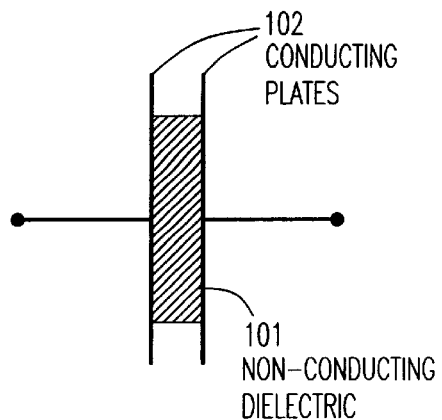
FIG. 1a is a schematic diagram of a typical capacitor.
Figure 1B:
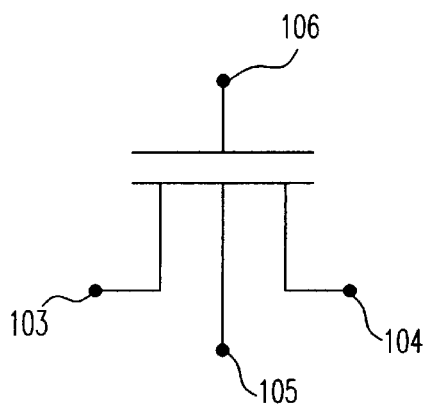
FIG. 1b is a schematic diagram of an electrical representation of a prior art MOSFET device.
Figure 1C:
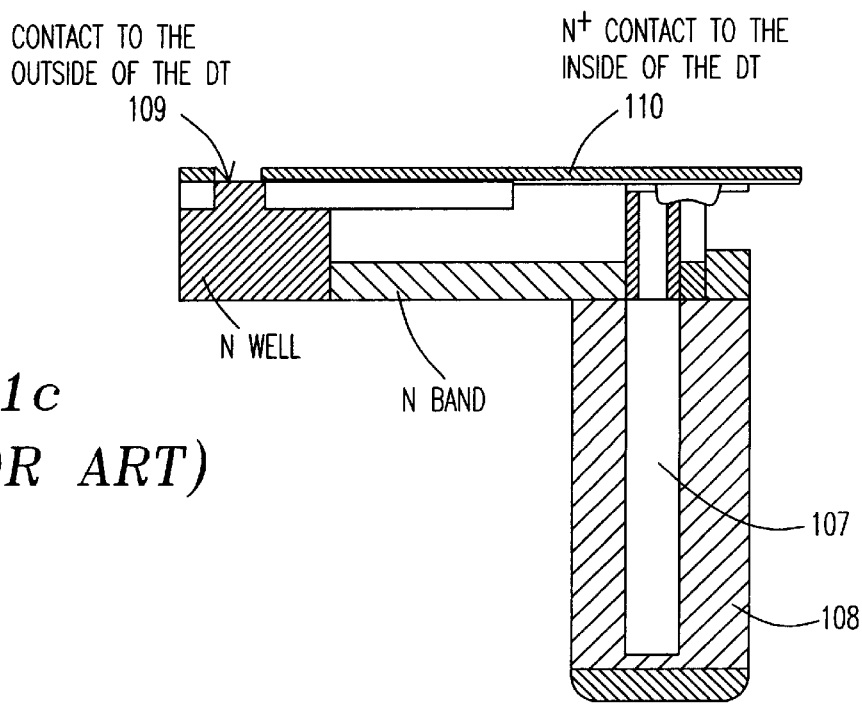
FIG. 1c is a schematic of a cross-section of a prior art deep trench capacitor anti-fuse.
Figure 2:
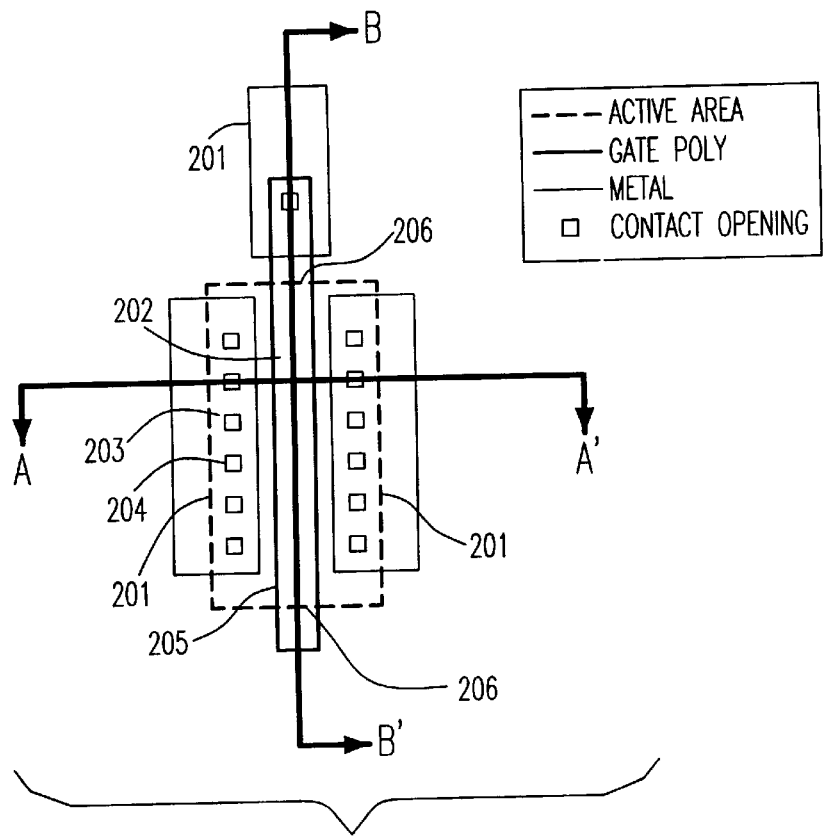
FIG. 2 illustrates a mask layout of a prior art MOSFET device.
Figure 3:
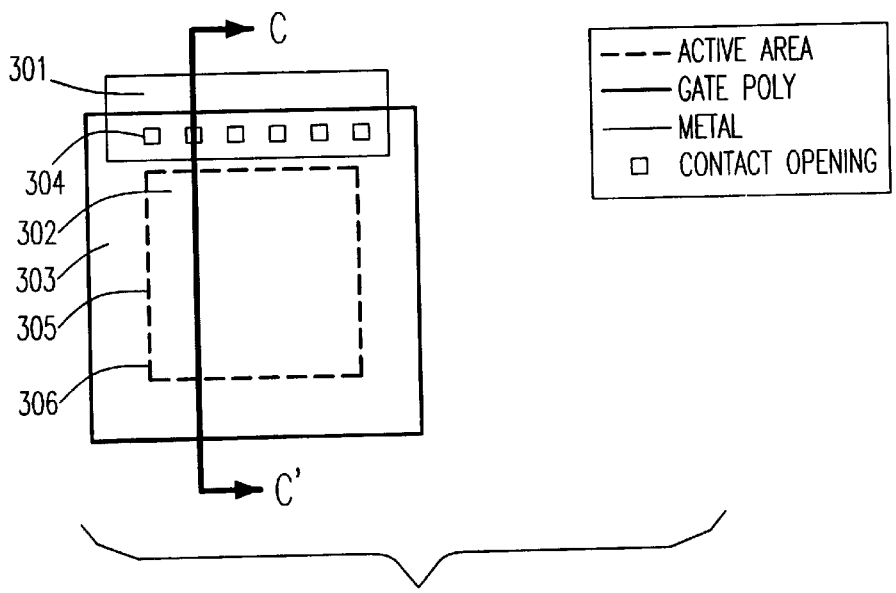
FIG. 3 illustrates a mask layout of a prior art MOS capacitor.
Figure 4:
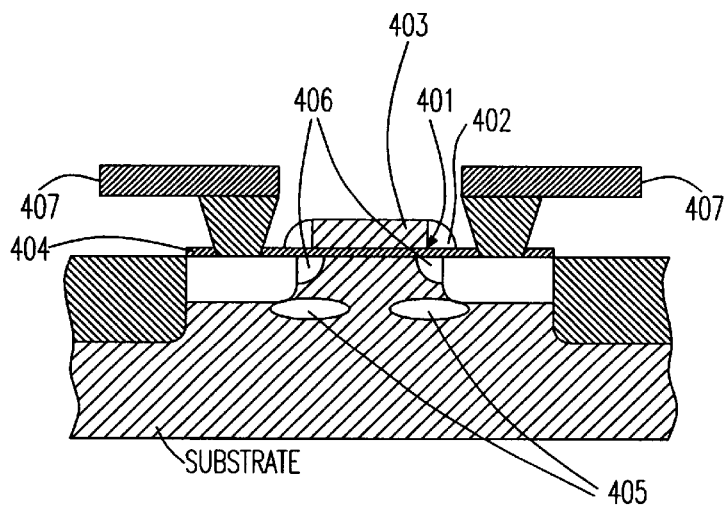
FIG. 4 is a schematic diagram of a cross-section of the prior art MOSFET structure shown in FIG. 2, along lines AA'.
Figure 5:
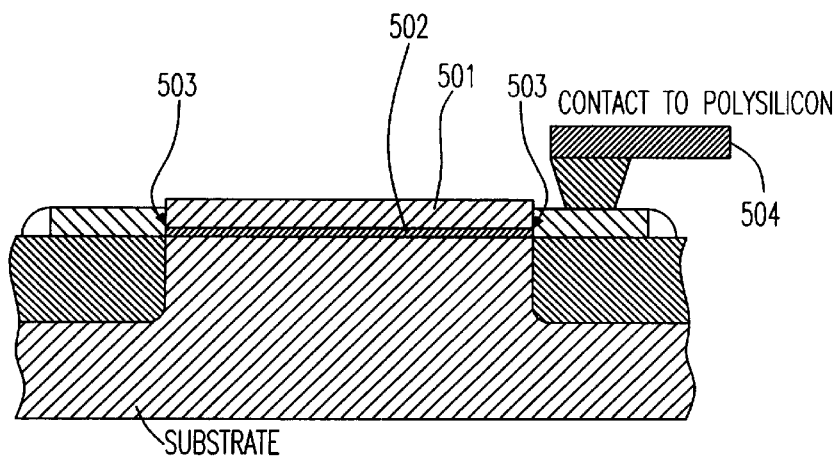
FIG. 5 shows a cross-section of the prior art MOSFET structure depicted in FIGS. 2 and 3, along lines BB' and CC', respectively.
Figure 6:
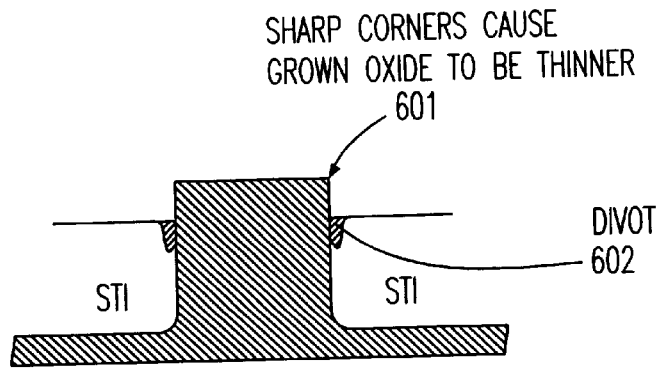
FIG. 6 shows a cross-section of the active area and shallow-trench isolation (STI) edge of a prior art MOS device before the gate oxide formation.

With reference to prior-art FIG. 4 showing a cross-section of a standard MOSFET structure, there is shown a 'halo implant' 405. This halo implant takes place after defining the polysilicon gate on the gate dielectric. The implantation of indium or other elements heavier than silicon at this stage of the MOSFET processing lowers the breakdown voltage of gate oxides below the intrinsic electrical breakdown voltage.

An anti-fuse can have its programming voltage lowered below the intrinsic gate oxide breakdown voltage by increasing the halo implantation dose to a predetermined level. By way of example, a dose of indium of 7E13 $cm^{-2}$, with an energy greater or equal to 110 keV, at an angle of 30° with respect to the vertical, for a gate oxide thickness of 2.65 nm, lowers the programming voltage below 3.9 V. The breakdown voltage for a gate oxide of the same thickness with no implantation is greater than 4.7 V.

B. Mask layouts for low voltage programmable anti-fuses

The mask layouts shown in FIGS. 7–12 are used to obtain low programming voltage anti-fuses. The effect of the edges on the breakdown voltage is enhanced when a corner is formed by the intersection of two edges. The mask layouts increase the number of corners and the length of the edges for a given area of the device.

Figure 7:
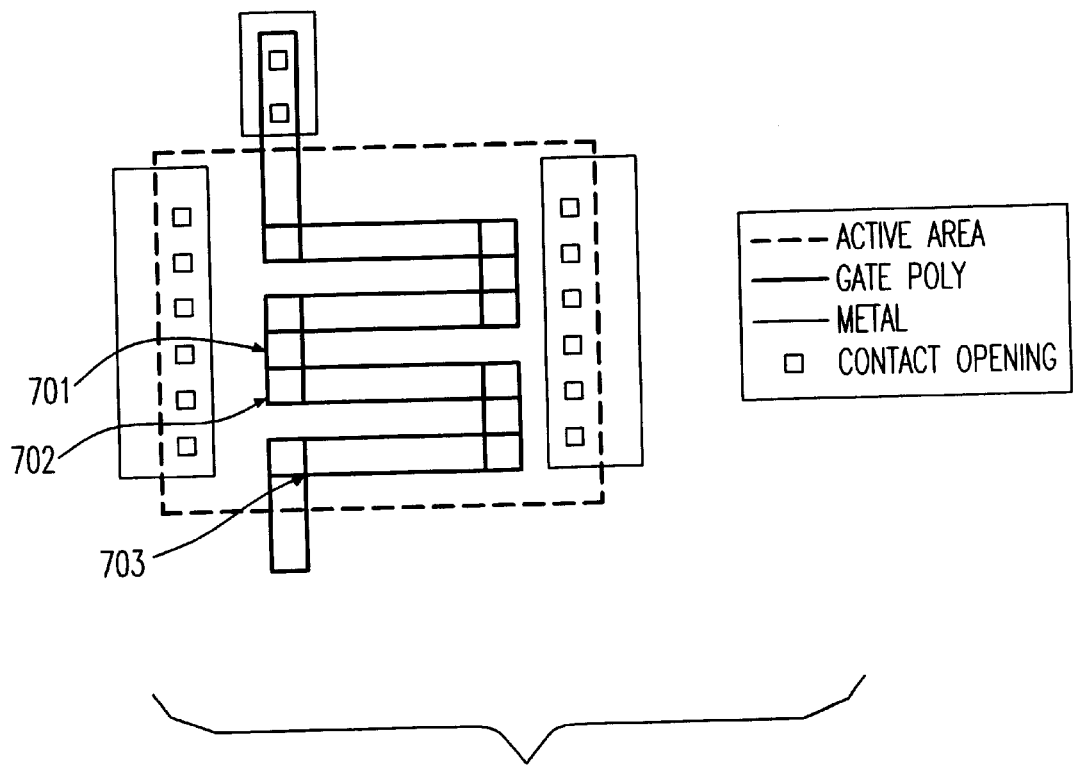
FIGS. 7–8 are schematic diagrams of the mask layout of an improved anti-fuse which makes use of the poly-gate edge on the active area, in accordance with the invention.
Figure 8:
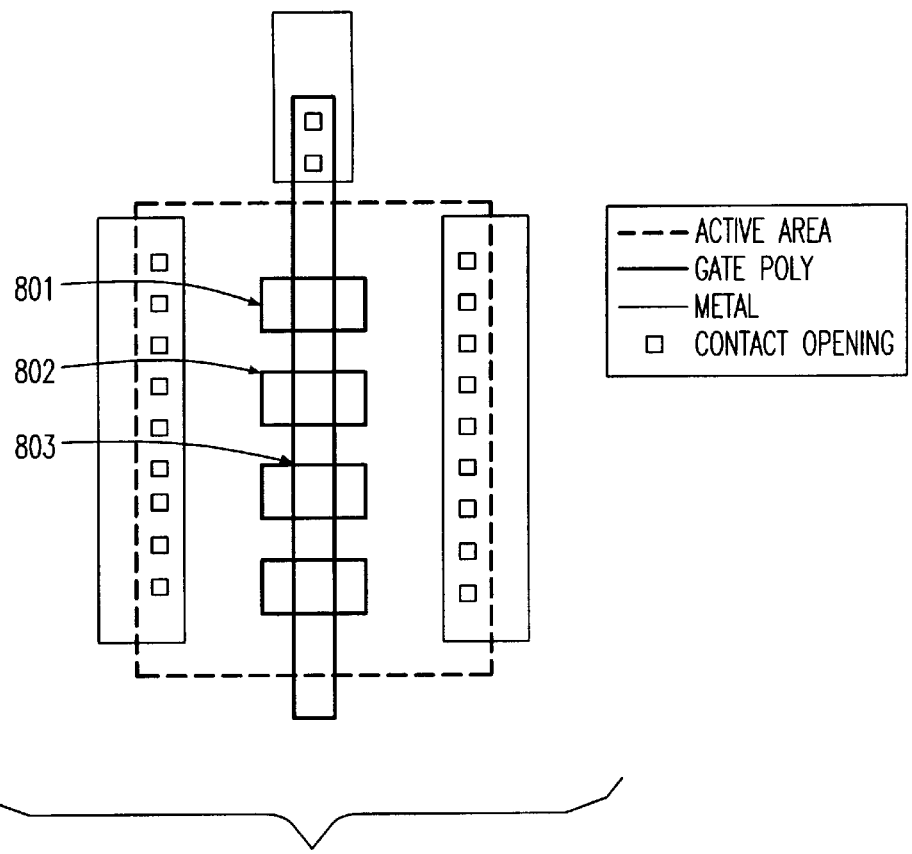

More specifically, referring to the mask layouts of FIGS. 7–8, there is shown a gate polysilicon edge on the active area provided with spacers, referenced by numerals 701 (FIG. 7) and 801 (FIG. 8). [Note: the spacers were previously explained with reference to prior art FIG. 4]. These mask layouts have convex corners, of which 702 and 802 are examples. Alternatively, numerals 703 and 803 illustrate concave corners.

Figure 9:
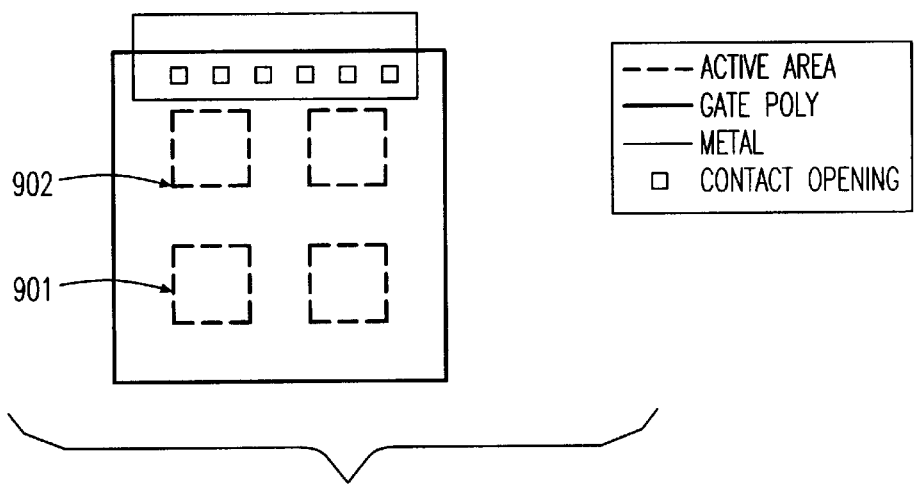
FIGS. 9–11 are schematic diagrams of the mask layout of an improved anti-fuse which makes use of the active area edge and STI, in accordance with the invention.
Figure 10:
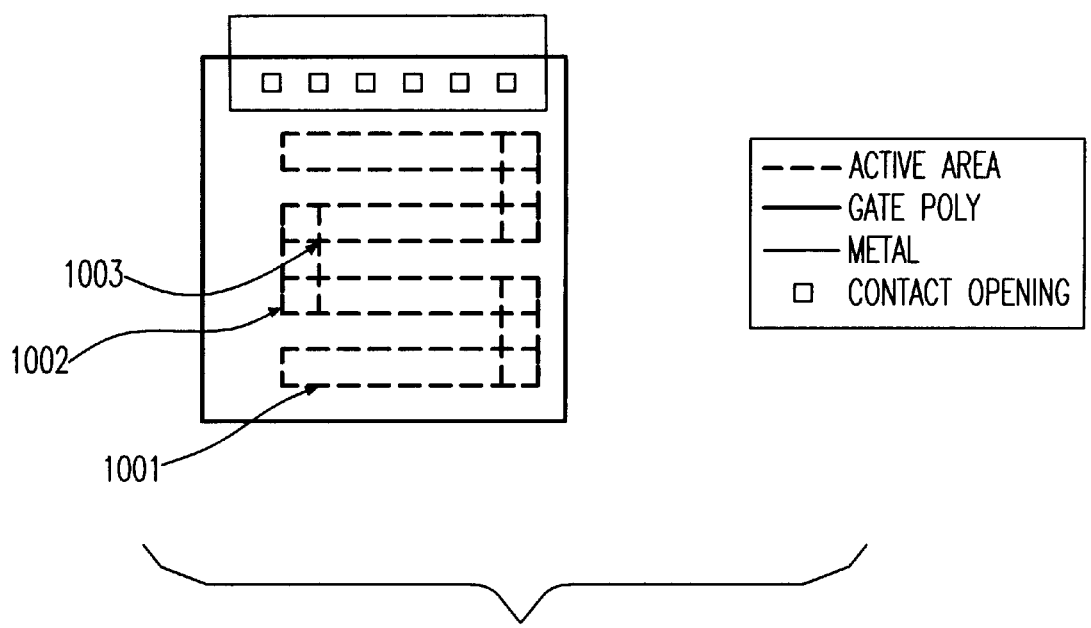
Figure 11:
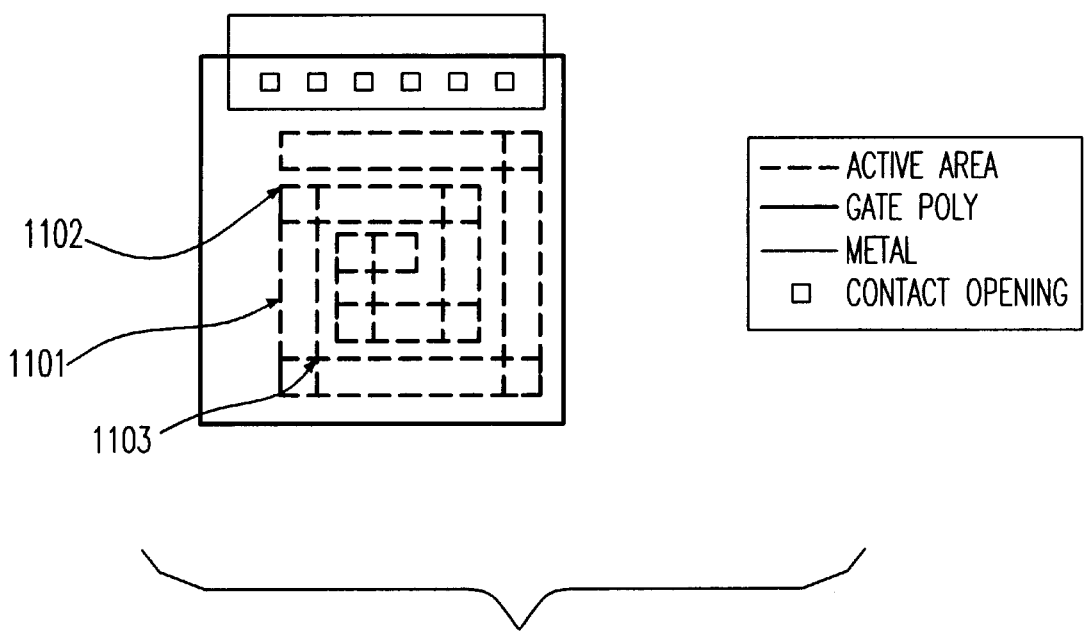

The mask layouts shown in FIGS. 9–11 make use of the edges between the active area and the STI. These are depicted by numerals 901, 1001 and 1101, respectively in FIGS, 9, 10 and 11. Examples of convex corners are 902, 1002 and 1102 and concave corners are 1003, 1103.

Figure 12:
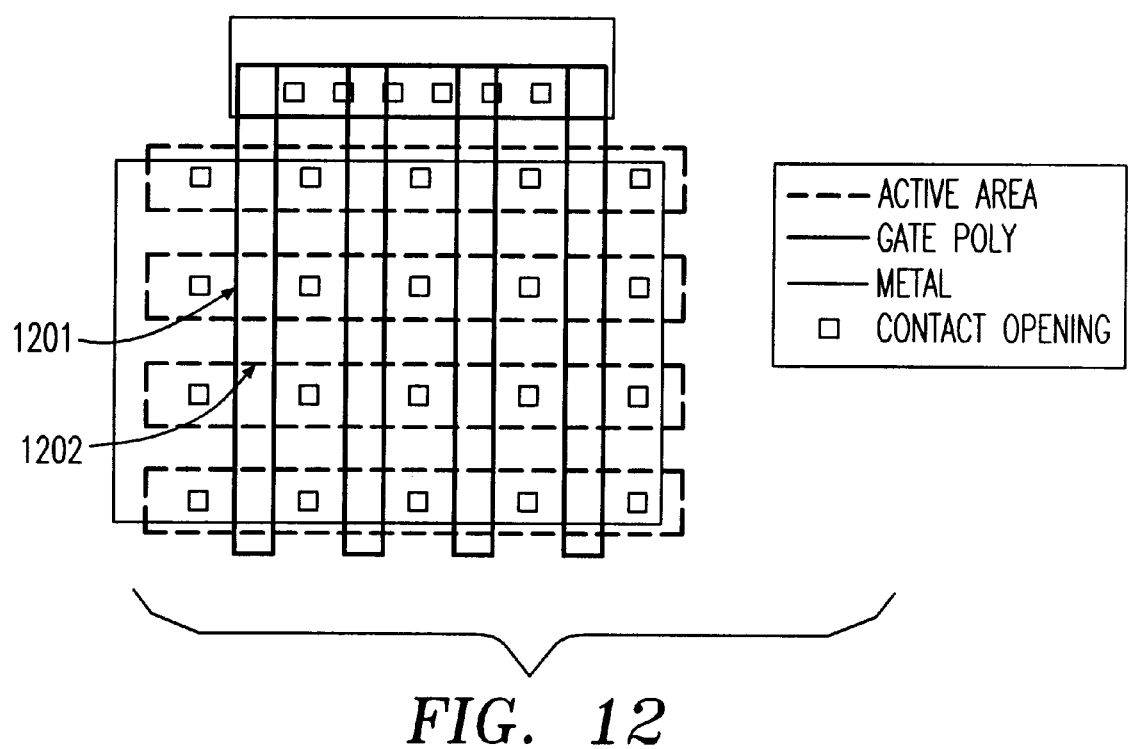
FIG. 12 is a schematic diagram of the mask layout of an improved anti-fuse which makes use of both, the STI-active area edge and the poly-gate active area edge, in accordance with the invention.

The mask layout illustrated in FIG. 12 makes use of 'long lengths' for both types of edges, e.g., 1201 and 1202.

All the above mask layouts result in structures which have larger perimeters, helping reduce the anti-fuse programming voltage.

C. Ensure formation of weak oxide at the STI—active area edqe

The process steps that prevent the gate oxide from weakening at the STI-active area edge, e,g., divot-fills and/or nitride and/or oxide pull-back steps, are kept out of the anti-fuse structures with the help of a blocking mask, divot-fills and/or the nitride and oxide pull-back steps. These steps are carried out for the remaining MOS devices on the same die. This contributes to the formation of electrically weaker oxides in the anti-fuses that lower the anti-fuse programming voltage to a value below the intrinsic gate oxide breakdown voltage.

D. Direct implantation of crate oxide with heavy ions.

Figure 13:
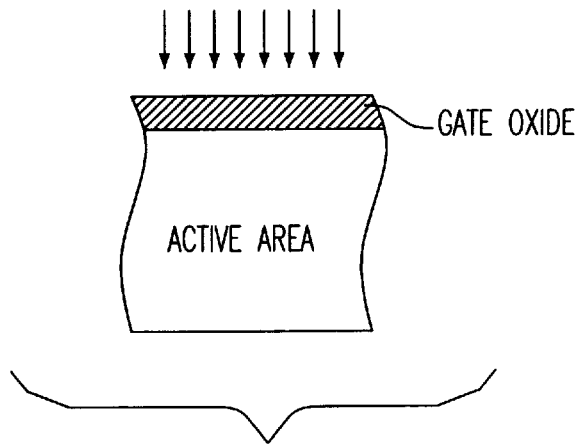
FIG. 13 shows the schematic of the implantation of heavy ions directly on the gate oxide prior into the polysilicon deposition to reduce the programming voltage of a MOSFET/MOS capacitor anti-fuse, in accordance with the invention.

The gate oxides of anti-fuse structures may be directly implanted with heavy ions, such as indium, arsenic, tellurium, etc., after the oxide growth, but before deposition of the polysilicon gate (FIG. 13). This implantation damages the oxide, causing it to breakdown at a lower programming voltage when compared to the breakdown voltage of the intrinsic gate oxide electrical breakdown.

DT Capacitor Anti-fuse [E–G]

E. Direct implantation of DT node dielectric

Figure 14:
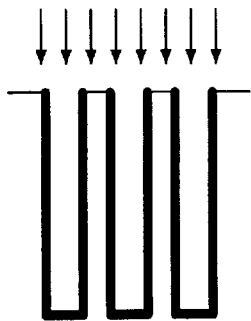
FIGS. 14a–14c show three different process steps which when incorporated in the DT capacitor anti-fuse fabrication will help reduce the programming voltage, in accordance with the invention.
Figure 14:
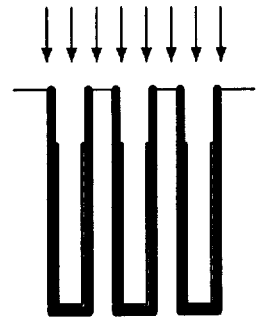
Figure 14:
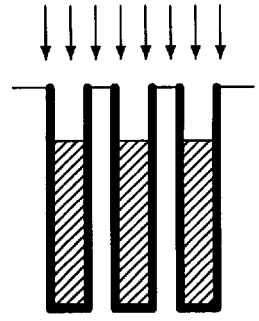

Referring now to FIG. 14a, there is shown a direct implant of the node dielectric in a deep trench (DT) capacitor. The node dielectric in the DT capacitor is created using nitride deposited by LPCVD, preferably at a thickness of about 5 nm, and it is followed by an oxidation step for 30 minutes at 900° C. In anti-fuse DT capacitor structures, the oxynitride node may now be implanted with heavy ions, such as indium. The implantation of the node reduces its electrical breakdown voltage. DT anti-fuses formed with these node are expected to display a lower programming voltage compared to the programming voltage of the DT anti-fuses that do not undergo the implantation step described in this section.

F. Implantation of the DT node dielectric after deposition of a thin layer of polysilicon Referring now to FIG. 14b, the node dielectric in a DT capacitor (anti-fuse) formed, as described in section E, can be coated with a layer of polysilicon conformal to the node dielectric layer with a thickness of the order of 200 nm. It can then be implanted by heavy ions, such as indium, with an energy of 110 keV and above. The DT anti-fuse formed with the additional steps of depositing a layer of polysilicon which are followed by the implantation display a lower programming voltage compared to a DT anti-fuse that does not undergo the steps mentioned in the previous section.

G. Implantation of ions into the DT capacitor after Recess I

The DT capacitor can be implanted with heavy ions, such as indium, following the first recess etch in the DT. Immediately after the DT node formation, the trench is filled with amorphous silicon. The amorphous silicon is then etched down to a depth inside the trench which is equal to the depth of the "collar" to be formed subsequently. This first etch of amorphous silicon is referred to "Recess I" (FIG. 14c) Following the implantation, the remaining DT capacitor fabrication process steps are continued using prevalent methods. The DT anti-fuse thus formed will have a programming voltage smaller than that of a DT anti-fuse that does not undergo the extra implantation step mentioned in this section.

In summary, several methods for reducing the programming voltage in anti-fuses have been described. The methods include:

(1) process variations in MOSFETs and MOS capacitors that are used as anti-fuses;

(2) modifying the mask layouts in MOSFET/MOS capacitor based anti-fuses; and (3) process variations in DT capacitor fabrication.

Whereas the invention has been described with the foregoing embodiments encompassing MOSFET/MOS and deep trench (DT) capacitors, those skilled in the art will appreciate that many changes and modifications in the fabrication steps forming the anti-fuse devices are possible. It is needless to say that all of these can be made without departing from the scope of the subject matter of the invention.

What is claimed is:

1. A method of fabricating an anti-fuse comprising the steps of:

forming a MOSFET device having a gate acting as one terminal of the anti-fuse, a source and a drain shorted to a substrate acting as a second terminal of the anti-fuse, and a gate dielectric separating the gate from the shorted source, drain and substrate; and implanting ions on the gate dielectric through a layer of polysilicon which is deposited on the gate dielectric, wherein the dose of the implantation controls the programming voltage of the anti-fuse.

2. The method as recited in claim 1, wherein the implantation of ions has a range of implantation that is greater or equal to the thickness of the polysilicon layer.

3. The method as recited in claim 1, wherein the ions are formed from elements that are selected from the group consisting of indium, gallium, arsenic, tellurium and any element heavier than silicon.

4. A method of fabricating an anti-fuse comprising the steps of:

forming a MOSFET device having a gate acting as one terminal of the anti-fuse, a source and a drain shorted to a substrate acting as a second terminal of the anti-fuse, and a gate dielectric separating the gate from the shorted source, drain and substrate; and implanting ions directly on the gate dielectric, wherein the programming voltage of the anti-fuse is adjusted by controlling the dose of the implantation.

5. A method of fabricating an anti-fuse, comprising the steps of:

forming a MOSFET device by defining an active area in a substrate;

forming a trench isolation outside the active area;

growing a dielectric layer on the active area;

depositing polysilicon on the dielectric layer;

defining a gate on the polysilicon;

forming a blanket deposition of insulation;

defining contacts to the source, gate, drain and substrate;

depositing and defining metal lines, shorting the source, the drain and the substrate to each other; and forming a gate oxide having a breakdown voltage that is lower than the intrinsic gate oxide electrical breakdown voltage.

6. The method as recited in claim 5, wherein the gate polysilicon and the active area are respectively defined by the masks have a shape which is selected from the group consisting of a spiral, independent islands, and any combination thereof.

7. A method of fabricating an anti-fuse, comprising the steps of:

forming a MOSFET device by defining an active area in a substrate;

forming a trench isolation outside the active area;

growing a dielectric layer on the active area;

depositing polysilicon on the dielectric layer;

defining a gate on the polysilicon;

forming a blanket deposition of insulation;

defining contacts to the source, gate, drain and substrate;

depositing and defining metal lines, shorting the source, the drain and the substrate to each other; and forming a gate oxide having a breakdown voltage that is lower than the intrinsic gate oxide electrical breakdown voltage.

8. A method of fabricating a MOSFET anti-fuse, comprising the steps of:

defining an active area in a silicon substrate;

forming a trench isolation outside the active area;

growing a gate oxide layer on the active area;

depositing polysilicon on the gate oxide layer;

forming a source and a drain;

defining a gate on the polysilicon;

blanket depositing an oxide layer;

defining contacts to the source, gate and drain; and depositing and defining metal lines, shorting the source and drain to each other and to the substrate, wherein the gate oxide formed at the edges of the junction between the active area and the trench isolation is thinner than the gate oxide on the active area, thereby lowering the programming voltage of the MOSFET anti-fuse.

9. A method of fabricating a deep trench (DT) anti-fuse, comprising the steps of:

forming a capacitor by way of a deep trench (DT) having a first conducting region around the deep trench acting as a first terminal of the capacitor, a second conducting region filling the deep trench acting as a second terminal of the capacitor, and a layer of dielectric on the walls of the deep trench separating the first and the second conducting regions; and implanting ions directly on the dielectric layer, wherein the dose of implantation controls the programming voltage of the anti-fuse.

10. The method as recited in claim 9, wherein the ions are formed from elements that are selected from the group consisting of indium, gallium, arsenic, tellurium and any element heavier than silicon.

11. A method of fabricating a deep trench (DT) anti-fuse, comprising the steps of:

forming a capacitor by way of a deep trench (DT) having a first conducting region around the deep trench acting as a first terminal of the capacitor, a second conducting region filling the deep trench acting as a second terminal of the capacitor, and a layer of dielectric on the walls of the deep trench separating the first and the second conducting regions;

depositing a layer of polysilicon conformal to the layer of dielectric; and implanting ions on the layer of dielectric through the layer of polysilicon, wherein the dose of implantation controls the programming voltage of the anti-fuse.

12. The method as recited in claim 11, wherein the implantation of ions has a range of implantation that is greater or equal to the thickness of the polysilicon layer.

13. The method as recited in claim 11, wherein the ions are formed from elements that are selected from the group consisting of indium, gallium, arsenic, tellurium and any element heavier than silicon.

14. A method of fabricating a deep trench (DT) anti-fuse, comprising the steps of:

forming a trench in a silicon substrate;

forming a dielectric node on the sidewalls of the trench;

filling the trench with amorphous silicon, and recessing the amorphous silicon to a predetermined depth;

forming a collar dielectric above the amorphous silicon;

refilling the trench and providing electrical contacts to the polysilicon within the trench, wherein ions are implanted into the trench after the recessing of the amorphous silicon, and wherein the dose of the implantation controls the programming voltage of the anti-fuse.

15. The method as recited in claim 14, wherein the ions are formed from elements that are selected from the group consisting of indium, gallium, arsenic, tellurium and any element heavier than silicon.

* * * * *